(12) United States Patent
Lin et al.

(10) Patent No.: US 12,256,654 B2
(45) Date of Patent: Mar. 18, 2025

(54) MEMORY CELL, METHOD OF FORMING THE SAME, AND SEMICONDUCTOR DEVICE HAVING THE SAME

(71) Applicant: Taiwan Semiconductor Manufacturing Company, Ltd., Hsinchu (TW)

(72) Inventors: Yu-Chao Lin, Hsinchu (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/515,226

(22) Filed: Nov. 20, 2023

(65) Prior Publication Data

US 2024/0090354 A1   Mar. 14, 2024

Related U.S. Application Data

(63) Continuation of application No. 17/730,235, filed on Apr. 27, 2022, now Pat. No. 11,864,477, which is a continuation of application No. 16/851,111, filed on Apr. 17, 2020, now Pat. No. 11,342,501.

(51) Int. Cl.
*H10N 70/00* (2023.01)
*H10N 70/20* (2023.01)

(52) U.S. Cl.
CPC ....... *H10N 70/8828* (2023.02); *H10N 70/061* (2023.02); *H10N 70/231* (2023.02); *H10N 70/841* (2023.02)

(58) Field of Classification Search
CPC ...................................................... H01L 45/44
See application file for complete search history.

(56) References Cited

U.S. PATENT DOCUMENTS

| 9,178,144 | B1* | 11/2015 | Sung | ............... H01L 45/16 |
| 2014/0339489 | A1* | 11/2014 | Kim | ............... H01L 45/12 |
| | | | | 257/2 |
| 2015/0340610 | A1* | 11/2015 | Jung | ............... H01L 27/2409 |
| | | | | 257/4 |
| 2021/0066590 | A1* | 3/2021 | Lin | ............... H01L 45/1675 |

* cited by examiner

*Primary Examiner* — Mounir S Amer
(74) *Attorney, Agent, or Firm* — JCIPRNET (57) ABSTRACT

Provided are a memory cell and a method of forming the same. The memory cell includes a bottom electrode, a top electrode, and a storage element layer. The storage element layer is disposed between the bottom and top electrodes. An extending direction of a sidewall of the storage element layer is different from an extending direction of a sidewall of the top electrode. A semiconductor device having the memory cell is also provided.

20 Claims, 9 Drawing Sheets

MEMORY CELL, METHOD OF FORMING THE SAME, AND SEMICONDUCTOR DEVICE HAVING THE SAME

CROSS-REFERENCE TO RELATED APPLICATION

This application is a continuation application of and claims the priority benefit of a prior application Ser. No. 17/730,235, filed on Apr. 27, 2022, now allowed. The prior application Ser. No. 17/730,235 is a continuation application of and claims the priority benefit of a prior application Ser. No. 16/851,111, filed on Apr. 17, 2020. The entirety of each of the above-mentioned patent applications is hereby incorporated by reference herein and made a part of this specification.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a PCM is employed to represent a unit of data. PCM has fast read and write times, non-destructive reads, and high scalability. However, the phase change layer of the PCM is easily to react with water, moisture, and halogen gas, so that the chemical stoichiometry composition ratio of the phase change layer is changed, thereby degrading the switchable performance of the phase change layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, the phase change material is patterned to form the phase change layer by the ion bombardment process, and a removed portion of the phase change material is re-sputtered to form the protective layer on surfaces of the hard mask layer, the top electrode, phase change layer in the same step. In the case, the protective layer is able to prevent the phase change layer from attacking by the moisture and/or harmful gas, thereby maintaining the switchable performance of the phase change layer. In addition, since the phase change layer is covered by the protective layer before forming the IMD layer, the queue time (Q-time) of the exposed phase change layer is able to be prolonged, thereby increasing the production flexibility and facilitating the mass production.

FIG. 1 to FIG. 7 are cross-sectional views of a method of forming a semiconductor device having a memory cell in accordance with a first embodiment. The memory cell illustrated in the following embodiments may be applied to, but not limited thereto, a phase change random access memory (PCRAM) cell, hereinafter referred to as a PCM cell.

Figure 1:
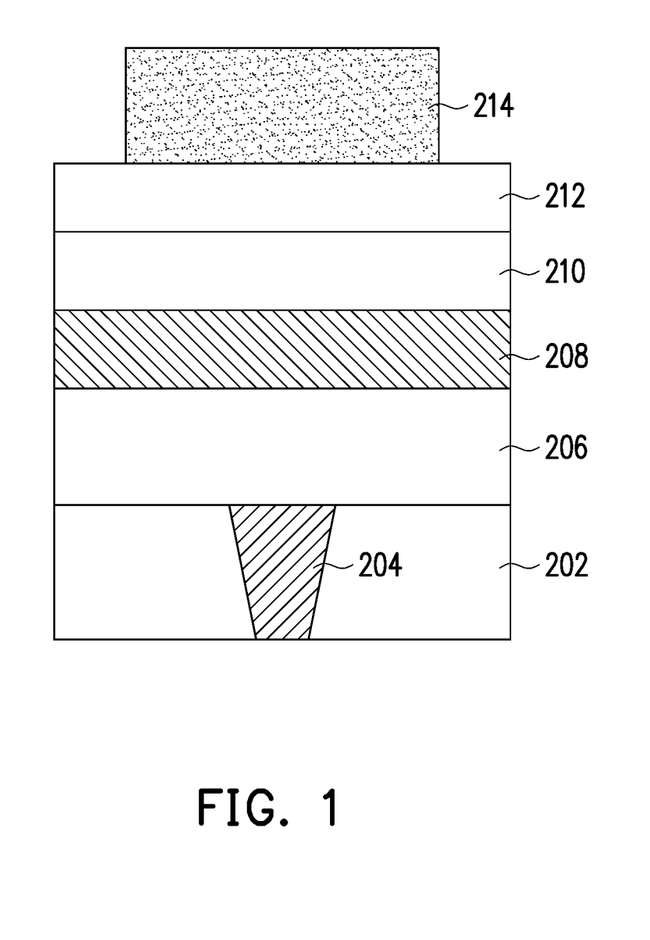
FIG. 1 to FIG. 7 are cross-sectional views of a method of forming a semiconductor device having a memory cell in accordance with a first embodiment.
Figure 7:
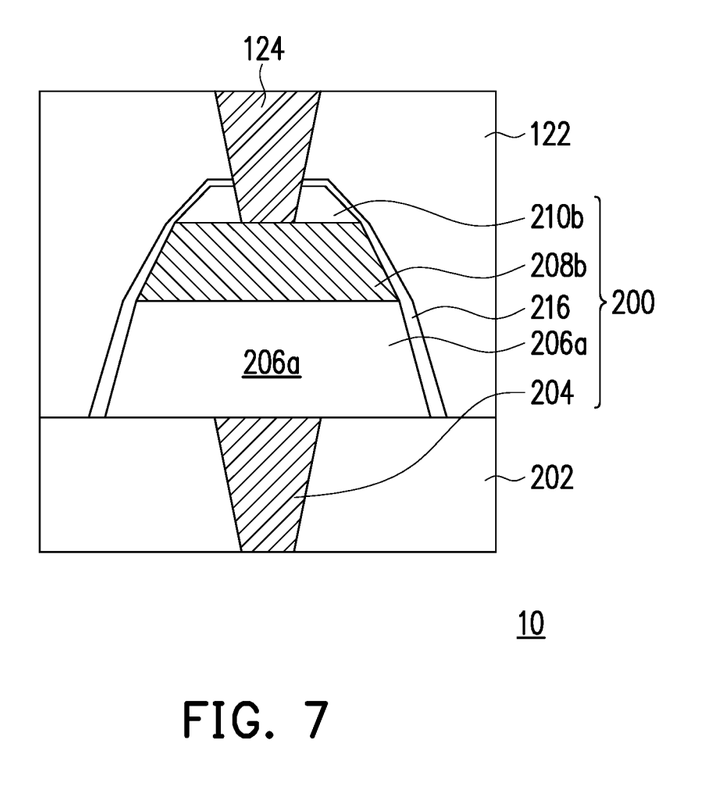

Referring to FIG. 1, a method of forming a semiconductor device 10 having a memory cell 200 (as shown in FIG. 7) includes following steps. First, an initial structure illustrated in FIG. 1 is provided. The initial structure includes a dielectric layer 202, a bottom electrode 204, a storage element material 206, a top electrode material 208, a hard mask material 210, a bottom anti-reflection coating (BARC) 212, and a photoresist pattern 214.

In some embodiments, the dielectric layer 202 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The dielectric layer 202 may be formed by any suitable method, such as chemical vapor deposition (CVD).

In some embodiments, the bottom electrode 204 is formed by a single damascene process including following steps. First, an opening is formed in the dielectric layer 202. Then, the opening is filled with a conductive material. After that, a planarization process (e.g., a CMP process) is performed to remove excessive conductive material, thereby forming the bottom electrode 204. In some embodiments, the bottom electrode 204 includes a conductive material, such as Ti, Co, Cu, AlCu, W, TiN, TiW, TiAl, TiAlN, Ru, $RuO_x$, or a combination thereof. In some alternative embodiments, the bottom electrode 204 is referred to as a heater that is electrically coupled to the overlying storage element material 206. The heater is configured to generate heat in proportion to a current applied across the heater. In the case, the heater may be made of titanium nitride (TiN), titanium carbide (TiC), tungsten nitride (WN), some other high resistance material, Ru, $RuO_x$, or a combination thereof. In addition, the heater may have a round, square, or rectangular profile in a top view.

The storage element material 206 is formed on and in contact with the dielectric layer 202 and the bottom electrode 204. In some embodiments, the storage element material 206 includes a phase change material when the memory cell 200 (FIG. 7) is the PCM cell. The phase change material may include a chalcogenide material, such as an indium (In)-antimony (Sb)-tellurium (Te) (IST) material or a germanium (Ge)-antimony (Sb)-tellurium (Te) (GST) material. The ISG material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other storage element materials include transition metal oxide materials or alloys including two or more metals, such as transition metals, alkaline earth metals, and/or rare earth metals. The storage element material 206 may be formed by any suitable method, such as PVD, atomic layer deposition (ALD), or the like. The storage element material 206 may have a thickness of about 20 nm to about 50 nm. Embodiments are not limited to a particular storage element material or materials associated with the storage elements of the PCM cell. In some alternative embodiments, the storage element material is used for a resistive random access memory (RRAM) cell, a magnetoresistive random access memory (MRAM) cell, a ferroelectric random access memory (FeRAM) cell, or a combination thereof. That is, the storage element material may include binary metal oxide materials, colossal magnetoresistive materials, and/or various polymer-based resistance variable materials, or the like.

The top electrode material 208 is formed on the storage element material 206, and the storage element material 206 is disposed between the top electrode material 208 and the bottom electrode 204. In some embodiments, the top electrode material 208 includes a conductive material, such as Ti, Co, Cu, AlCu, W, TiN, TiW, TiAl, TiAlN, or a combination thereof. The top electrode material 208 and the bottom electrode 204 may have the same material or different materials. For example, the top electrode material 208 and the bottom electrode 204 are both made of TiN. The top electrode material 208 may be formed by any suitable method, such as CVD, physical vapor deposition (PVD), or the like. The top electrode material 208 may have a thickness of about 5 nm to about 20 nm.

The hard mask material 210 is formed on the top electrode material 208. In some embodiments, the hard mask material 210 includes an inorganic dielectric material, such as SiON, SiN, SiC, SiOC, SiCN, or a combination thereof. The hard mask material 210 may be formed by any suitable method, such as CVD. The hard mask material 210 may have a thickness of about 10 nm to about 30 nm.

The BARC 212 is formed on the hard mask material 210, and the BARC 212 is disposed between the hard mask material 210 and the photoresist pattern 214 to reduce reflection. The BARC 212 may be formed by any suitable method, such as CVD, spin-on, or the like. The BARC 212 may have a thickness of about 150 nm to about 500 nm.

The photoresist pattern 214 is formed on the BARC 212. As shown in FIG. 1, the photoresist pattern 214 may correspond to the bottom electrode 204. That is, the photoresist pattern 214 is disposed directly on the bottom electrode 204. In some embodiments, the photoresist pattern 214 includes a positive photoresist or a negative photoresist, and may be formed by any suitable method, such as spin-coating. The photoresist pattern 214 may have a thickness of about 80 nm to about 150 nm.

Figure 2:
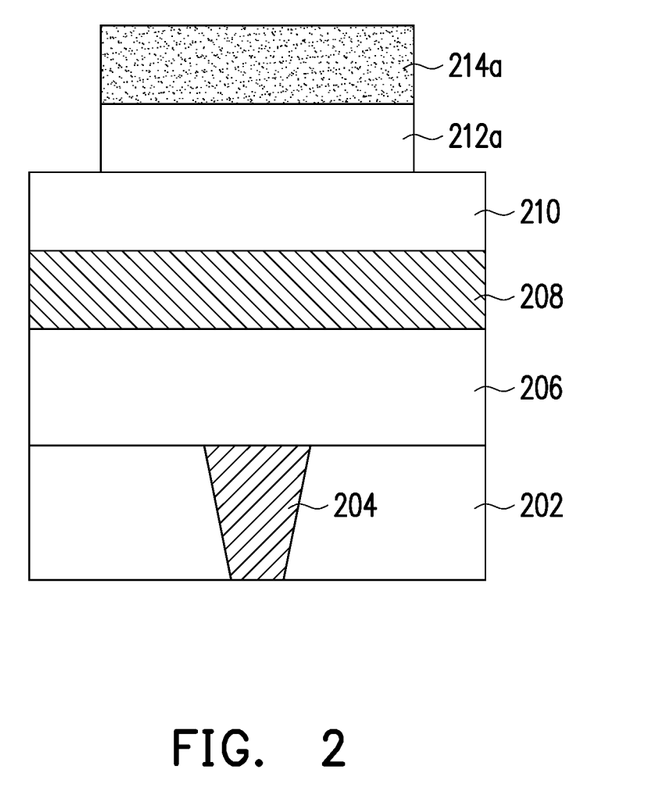

Referring to FIG. 1 and FIG. 2, the BARC 212 is patterned by using the photoresist pattern 214 as a mask. In the case, as shown in FIG. 2, a portion of the BARC 212 is removed and the hard mask material 210 is exposed by a BARC 212a and a photoresist pattern 214a thereon. The photoresist pattern 214 may be consumed during the patterning, thus the photoresist pattern 214a may have a thickness less than the thickness of the photoresist pattern 214.

Figure 3:
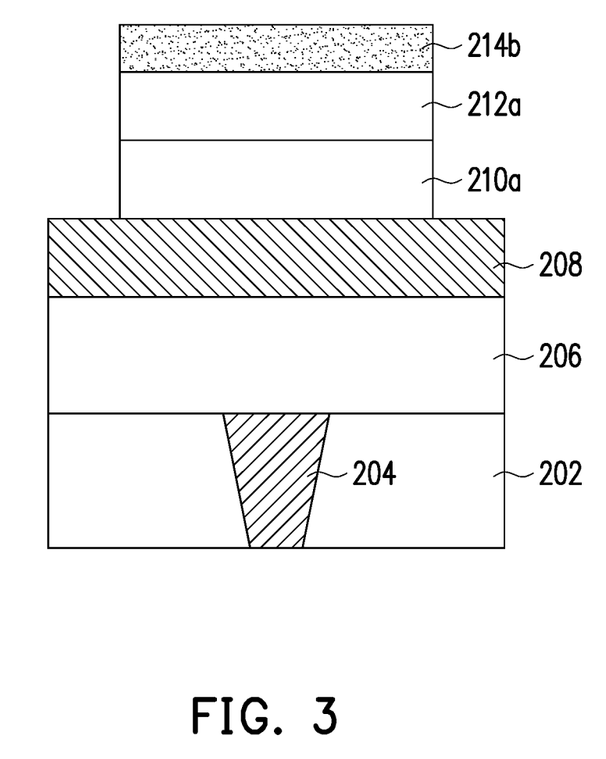
Figure 4:
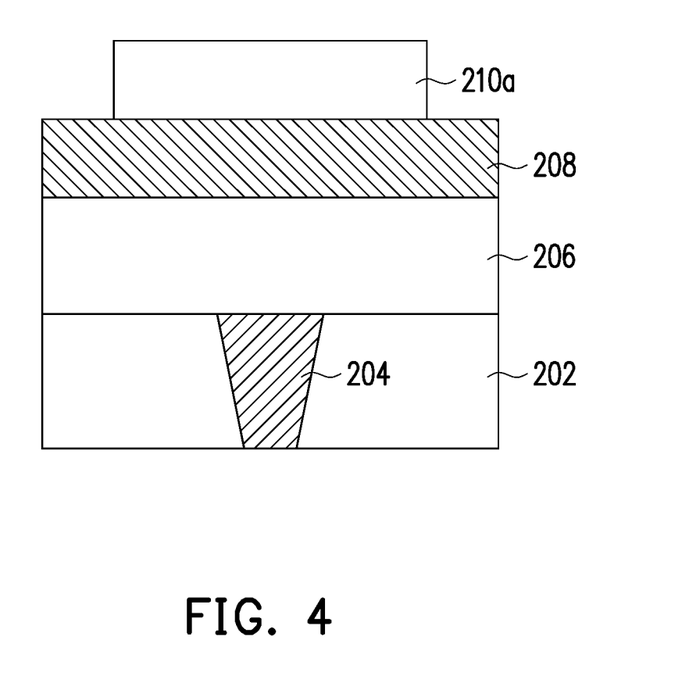

Referring to FIG. 2 to FIG. 4, the hard mask material 210 is patterned by using the photoresist pattern 214a and the BARC 212a as a mask. In the case, as shown in FIG. 3, a portion of the hard mask material 210 is removed and the top electrode material 208 is exposed by a hard mask layer 210a, the BARC 212a and a photoresist pattern 214b. The photoresist pattern 214a may be consumed during the patterning, thus the photoresist pattern 214b may have a thickness less than the thickness of the photoresist pattern 214a. After forming the hard mask layer 210a, the photoresist pattern 214b and the BARC 212a are removed by any suitable method, such as $O_2$ ashing, as shown in FIG. 4.

Figure 5:
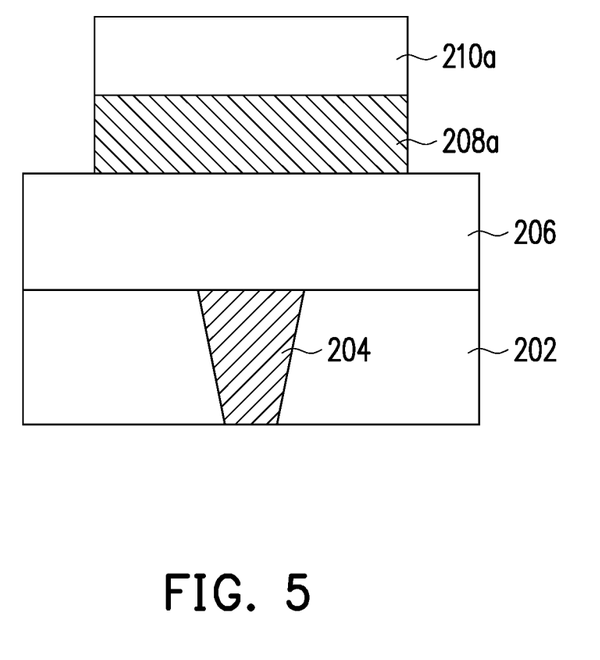

Referring to FIG. 4 and FIG. 5, the top electrode material 208 is patterned by using the hard mask layer 210a as a mask. In the case, as shown in FIG. 5, a portion of the top electrode material 208 is removed and the storage element material 206 is exposed by a top electrode 208a and the hard mask layer 210a thereon.

Figure 6:
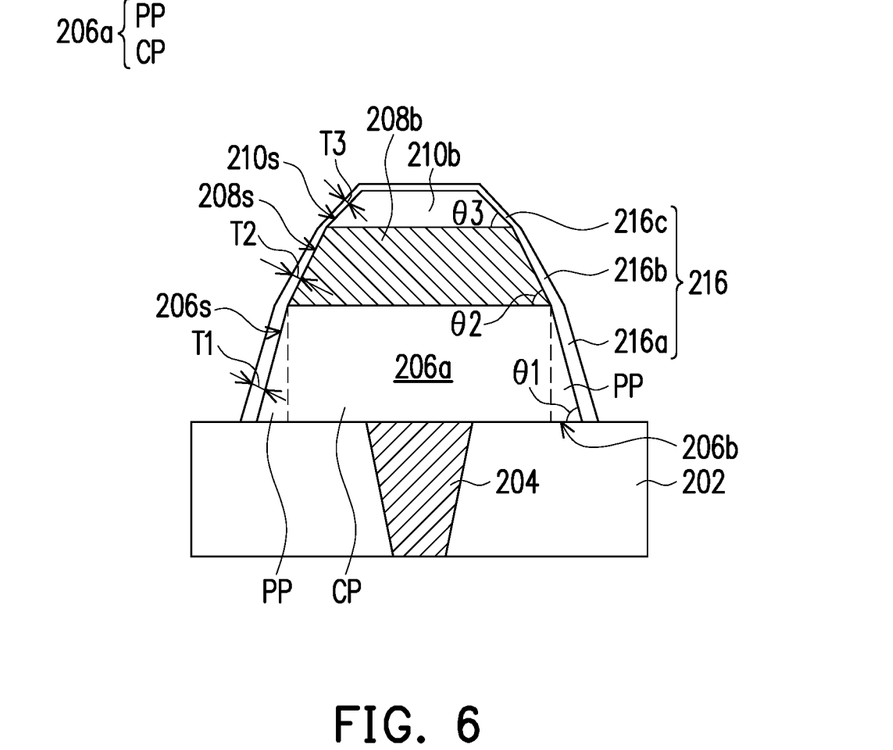

Referring to FIG. 5 and FIG. 6, an ion bombardment process is performed to remove a portion of the storage element material 206 thereby forming a storage element layer 206a, and a protective layer 216 is formed on surfaces of the hard mask layer 210b, the top electrode 208b, and the storage element layer 206a in the same step. In some embodiments, the said ion bombardment process is referred to as an isotropic physical etching process, rather than a chemical etching process. Specifically, in the ion bombardment process, an inert gas may be excited or dissociated into a plasma, which includes various different charged ions, radicals, molecules, and electrons. Thereafter, the charged ions bombard a surface of the storage element material 206 due to the potential difference. Since the removal rate of the upper portion of the storage element material 206 is greater than the removal rate of the lower portion of the storage element material 206, the storage element material 206 is trimmed or cut as a storage element layer 206a with a first inclined sidewall 206s, as shown in FIG. 6. Similarly, after the ion bombardment process, the top electrode 208b with a second inclined sidewall 208s and the hard mask layer 210b with a third inclined sidewall 210s are formed. In some embodiments, the first inclined sidewall 206s has an angle θ1 relative to a bottom surface 206b of the storage element layer 206a, the second inclined sidewall 208s has an angle θ2 relative to the bottom surface 206b of the storage element layer 206a, and the third inclined sidewall 210s has an angle θ3 relative to the bottom surface 206b of the storage element layer 206a. As shown in FIG. 6, the angle θ1 of the first inclined sidewall 206s is greater than the angle θ2 of the second inclined sidewall 208s, and the angle θ2 of the second inclined sidewall 208s is greater than the angle θ3 of the third inclined sidewall 210s, namely, θ1>θ2>θ3. In the case, a composite structure including the storage element layer 206a, the top electrode 208b, and the hard mask layer 210b may be referred to as a bell-shaped structure, which has a better conformal window for subsequently formed protective layer 216, the IMD layer 122, or an optional spacer/liner between the protective layer 216 and the IMD layer 122. Further, a top of the hard mask layer 210a is also be partially consumed, thus the hard mask layer 210b has a thickness less than a thickness of the hard mask layer 210a.

In some embodiments, the ion bombardment process includes using the inert gas selected from He, Ne, Ar, Kr, Xe, or a combination thereof, such as Ar, in a flowrate of about 20 standard cubic centimeters per minute (sccm) to about 500 sccm (e.g., 500 sccm). The ion bombardment process may be performed at pressure in a range of 3 mTorr to 15 mTorr (e.g., 3 mTorr), RF source power in a range of 300 W to 1200 W (e.g., 1000 W), RF bias voltage in a range of 20 V to 300 V (e.g., 600 V), and process time in a range of 10 seconds to 300 seconds (e.g., 15 seconds). However, the embodiments of the present disclosure are not limited thereto, in other embodiments, the ion bombardment process may have other parameters to adjust.

It should be noted that, during the ion bombardment process, a removed portion of the storage element material 206 is re-sputtered on the surfaces of the storage element layer 206a, the top electrode 208b, and the hard mask layer 210b to form the protective layer 216. In some embodiments, the storage element layer 206a and the protective layer 216 are in-situ formed in the same chamber. Herein, the term "in-situ" refers to as performing the ion bombardment and re-sputter processes in the same processing system or chamber. In other words, the structure illustrated in FIG. 6 remain under a vacuum condition and is not exposed to an external ambient or an oxygen-containing ambient during the ion bombardment and re-sputter processes. From another perspective, the protective layer 216 is deposited while the storage element material 206 is etched during the ion bombardment process. That is, the etching step and re-depositing step are performed simultaneously.

As shown in FIG. 6, the protective layer 216 may completely cover the surfaces of the storage element layer 206a, the top electrode 208b, and the hard mask layer 210b. However, the embodiments of the present disclosure are not limited thereto, in other embodiments, the protective layer 216 at least covers the surface of storage element layer 206a. In some embodiment, the protective layer 216 includes a first portion 216a, a second portion 216b, and a third portion 216c. The first portion 216a covering or contacting the first inclined sidewall 206s may have a first thickness T1 in a range of about 2 nm to about 1 nm. The second portion 216b covering or contacting the second inclined sidewall 208s may have a second thickness T2 in a range of about 1.5 nm to about 1 nm. The third portion 216c covering or contacting the third inclined sidewall 210s may have a third thickness T3 in a range of about 0.5 nm to about 1 nm. The first thickness T1 is greater than the second thickness T2, and the second thickness T2 is greater than the third thickness T3, namely, T1>T2>T3. However, the embodiments of the present disclosure are not limited thereto, in other embodiments, the first thickness T1 is less than or equal to the second thickness T2, and the second thickness T2 is less than or equal to the third thickness T3, namely, T1≤T2≤T3.

In the present embodiment, since the protective layer 216 is re-sputtered and/or formed from the removed portion of the storage element material 206, the protective layer 216 and the storage element material 206 have the same material. For example, when the storage element material 206 is made of $Ge_2Sb_2Te_5$, the protective layer 216 is also made of $Ge_2Sb_2Te_5$. It should be noted that the protective layer 216 is able to protect the storage element layer 206a from attacking by the moisture and/or harmful gas. Generally, when the storage element material is patterned to form the storage element layer exposed to the external environment, the storage element layer is easily to react with moisture and/or harmful gas, so that the chemical stoichiometry composition ratio of the storage element layer is changed, thereby degrading the switchable performance of the storage element layer. In the present embodiment, since the storage element layer 206a is formed by the ion bombardment process which is accompanied by the re-sputter process to form the protective layer 216 on the sidewall 206s of the storage element layer 206a. In the case, the storage element layer 206a may be protected by the protective layer 216 and maintain its chemical stoichiometry composition ratio. In some embodiments, the storage element layer 206a is divided into a center portion CP and a peripheral portion PP surrounding the center portion CP, and the center portion CP and the peripheral portion PP may have the same atomic ratio. Herein, the term "atomic ratio" is referred to as a measure of the ratio of atoms of one kind to another kind. For example, when the storage element layer 206a is made of $Ge_2Sb_2Te_5$, the atomic ratios of Ge, Sb, and Te in the center portion CP and the peripheral portion PP are both 2:2:5 as the original design. In other words, by the ion bombardment and re-sputter processes, the property of the storage element layer 206a may be maintained, thereby enhancing the switchable performance of the memory cell.

Referring to FIG. 7, a dielectric layer 122 is formed on the protective layer 216 and wraps the bell-shaped structure. In some embodiments, the dielectric layer 122 is referred to as an inter-metal dielectric (IMD) layer which includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The dielectric layer 122 may be formed by any suitable method, such as CVD. A conductive via 124 is then formed in the dielectric layer 122 to electrically connect the top electrode 208b. In some embodiments, the conductive via 124 is formed by a single damascene process including following steps. First, an opening is formed in the dielectric layer 122. The opening penetrates though the dielectric layer 122, the protective layer 216, the hard mask layer 210b to reach the top electrode 208b. Then, the opening is filled with a conductive material. After that, a planarization process (e.g., a CMP process) is performed to remove excessive conductive material, thereby forming the conductive via 124. In some embodiments, the conductive via 124 includes metals or metal alloys including one or more of Al, AlCu, Cu, T1, TiN, W, or the like.

As shown in FIG. 7, the semiconductor device 10 with the memory cell 200 is accomplished after forming the conductive via 124. Specifically, the memory cell 200 may include the bottom electrode 204, the top electrode 208b, the storage element layer 206a between the bottom and top electrodes 204 and 208b, and the protective layer 216 covering the storage element layer 206a and the top electrode 208b. The memory cell 200 further includes the hard mask layer 210b on the top electrode 208b, and the protective layer 216 further covers the surface of the hard mask layer 210b.

In some embodiments, the storage element layer 206a includes a phase change material when the memory cell 200 is the PCM cell. When the storage element layer 206a is a phase change material layer (hereinafter referred to as the PCM layer 206a), the PCM layer 206a has a variable phase representing a data bit. For example, the PCM layer 206a has a crystalline phase and an amorphous phase which are interchangeable. The crystalline phase and the amorphous phase may respectively represent a binary "1" and a binary "0", or vice versa. Accordingly, the PCM layer 206a has a variable resistance that changes with the variable phase of the PCM layer 206a. For example, the PCM layer 206a has a high resistance in the amorphous phase and a low resistance in the crystalline phase.

In the operation of the PCM cell 200, the data state of the PCM cell 200 is read by measuring the resistance of the PCM cell 200 (i.e., the resistance from the bottom electrode 204 to the top electrode 208b). The phase of the PCM layer 206a represents the data state of the PCM cell 200, the resistance of the PCM layer 206a, or the resistance of the PCM cell 200. Further, the data state of the PCM cell 200 may be set and reset by changing the phase of the PCM layer 206a.

In some embodiments, the phase of the PCM layer 206a is changed by heating. For example, the bottom electrode (or heater) 204 heats the PCM layer 206a to a first temperature that induces crystallization of the PCM layer 206a, so as to change the PCM layer 206a to the crystalline phase (e.g., to set the PCM cell 200). Similarly, the bottom electrode (or heater) 204 heats the PCM layer 206a to a second temperature that melts the PCM layer 206a, so as to change the PCM layer 206a to the amorphous phase (e.g., to reset the PCM cell 200). The first temperature is lower than the second temperature. In some embodiments, the first temperature is 100° C. to 200° C. and the second temperature is 150° C. to 400° C.

The amount of heat generated by the bottom electrode 204 varies in proportion to the current applied to the bottom electrode 204. That is, the PCM layer 206a is heated up to a temperature (i.e., the second temperature) higher than the melting temperature when a current passes through it. The temperature is then quickly dropped below the crystallization temperature. In the case, a portion of the PCM layer 206a contacting the bottom electrode 204 is changed to the amorphous state with high resistivity, and thus the state of the PCM cell 200 is changed to a high resistance state. Then, the portion of the PCM layer 206a may be back to the crystalline state by heating up the PCM layer 206a to a temperature (i.e., the first temperature) higher than the crystallization temperature and lower than the melting temperature, for a certain period.

Based on above, it is known that the PCM layer 206a is a key layer for operating the PCM cell 200. In the present embodiment, the PCM layer 206a is formed by the ion bombardment which is accompanied by the re-sputter process to form the protective layer 216 covering the PCM layer 206a. In the case, the PCM layer 206a is protected by the protective layer 216 from attacking by the moisture and/or harmful gas, without any additional spacer or liner. This can simplify the process steps, save the manufacturing costs, and maintain the chemical composition stoichiometry of the PCM layer 206a as the original design, thereby enhancing the switchable performance of the PCM layer 206a. Moreover, since the PCM layer 206a is covered by the protective layer 216 before forming the IMD layer 122, the queue time (Q-time) of the exposed PCM layer 206a is able to be prolonged, thereby increasing the production flexibility and facilitating the mass production. Further, a material of the protective layer 216 is derived or formed from the PCM layer 206a. Compared with the conventional SiN liner, the protective layer 216 is able to avoid the heat being stored or trapped at the sidewall of the PCM layer 206a during operating the PCM cell 200.

Figure 8:
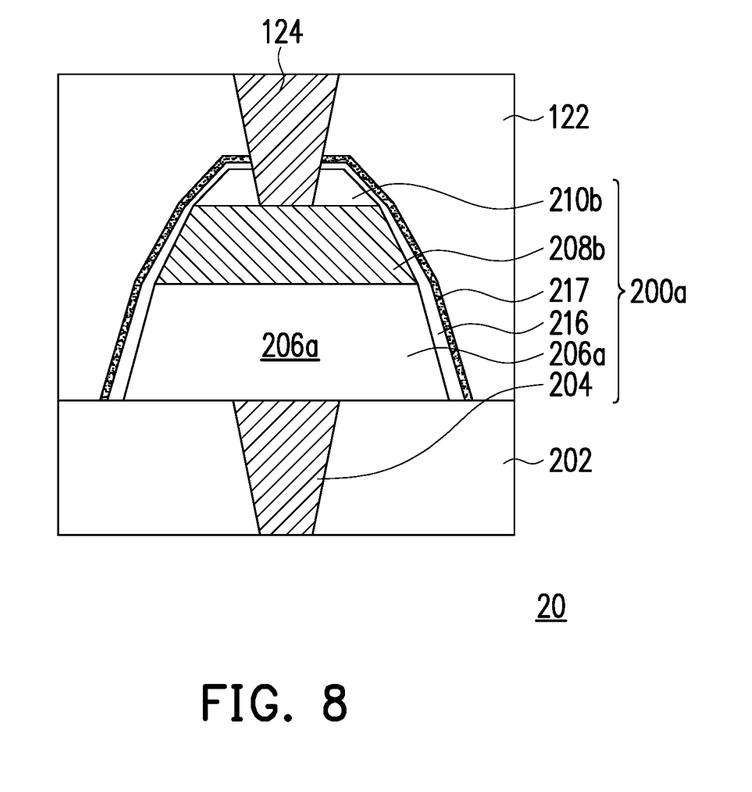
FIG. 8 is a cross-sectional view of a semiconductor device having a memory cell in accordance with a second embodiment.

FIG. 8 is a cross-sectional view of a semiconductor device having a memory cell in accordance with a second embodiment.

Referring to FIG. 8, a memory cell 200a of a semiconductor device 20 of the second embodiment is similar to the memory cell 200 of the semiconductor device 10 of the first embodiment. That is, the structures, materials, and functions of the memory cell 200a are similar to those of the memory cell 200, and thus the details are omitted herein. The main difference between the memory cell 200a and the memory cell 200 lies in that the memory cell 200a further include a surface treatment layer 217 covering the protective layer 216. In some embodiments, the surface treatment layer 217 is formed by performing a surface treatment on the structure illustrated in FIG. 6 after the ion bombardment process. The surface treatment may include a nitridation treatment. The nitridation treatment may include introducing a nitrogen gas, so that the nitrogen gas reacts with metal elements of the protective layer 216. In the case, as shown in FIG. 8, the surface treatment layer 217 continuously and conformally extends on the protective layer 216. In some embodiments, the surface treatment layer 217 may have a thickness of about 0.5 nm to about 1.5 nm. In addition to the protective layer 216, the surface treatment layer 217 provides more protection for the storage element layer 206a from attacking by the moisture and/or harmful gas, thereby maintaining the switchable performance of the memory cell 200a. In some alternative embodiments, the surface treatment layer 217 may be discretely distributed on the protective layer 216. That is, the surface treatment layer 217 may discontinuously cover the surface of the protective layer 216.

In some embodiments, the nitridation treatment may be performed by introducing a nitrogen gas in a flowrate of about 100 sccm to about 2000 sccm (e.g., 300 sccm). The nitridation treatment may include a plasma nitridation which is performed at pressure in a range of 5 mTorr to 100 mTorr (e.g., 15 mTorr), RF source power in a range of 300 W to 1200 W (e.g., 500 W), RF bias voltage in a range of 0 V to 50 V (e.g., 30 V), and process time in a range of 20 seconds to 600 seconds (e.g., 120 seconds). However, the embodiments of the present disclosure are not limited thereto, in other embodiments, the nitridation treatment may have other parameters to adjust.

In some embodiments, since a material of the surface treatment layer 217 is derived or formed from the protective layer 216, the surface treatment layer 217 may include metal nitride having the metal elements from the protective layer 216. For example, when the protective layer 216 is made of $Ge_2Sb_2Te_5$, the surface treatment layer 217 may include GeN, SbN, TeN, or a combination thereof. In addition, since the surface treatment layer 217 may expose to the external ambient or oxygen-containing ambient, the surface treatment layer 217 further includes GeO, SbO, TeO, or a combination thereof.

Optionally, the memory cell 200a further includes a selector (not shown) between the top electrode 208b and the conductive via 124. The selector may include an ovonic threshold switch (OTS) material. The OTS material may include a chalcogenide material that is responsive to an applied voltage across the selector. For an applied voltage that is less than a threshold voltage, the selector remains in an "off" state, e.g., an electrically nonconductive state. Alternatively, responsive to an applied voltage across the selector that is greater than the threshold voltage, the selector enters an "on" state, e.g., an electrically conductive state. That is, the selector is referred to as a switch for determining to turn on or turn off the memory cell 200a. In some alternative embodiments, the chalcogenide material of the OTS material is different from the chalcogenide material of the storage element layer 206a. In other embodiments, the selector is optionally formed between the top electrode 208b and the conductive via 124 of the memory cell 200 illustrated in FIG. 7.

Figure 9:
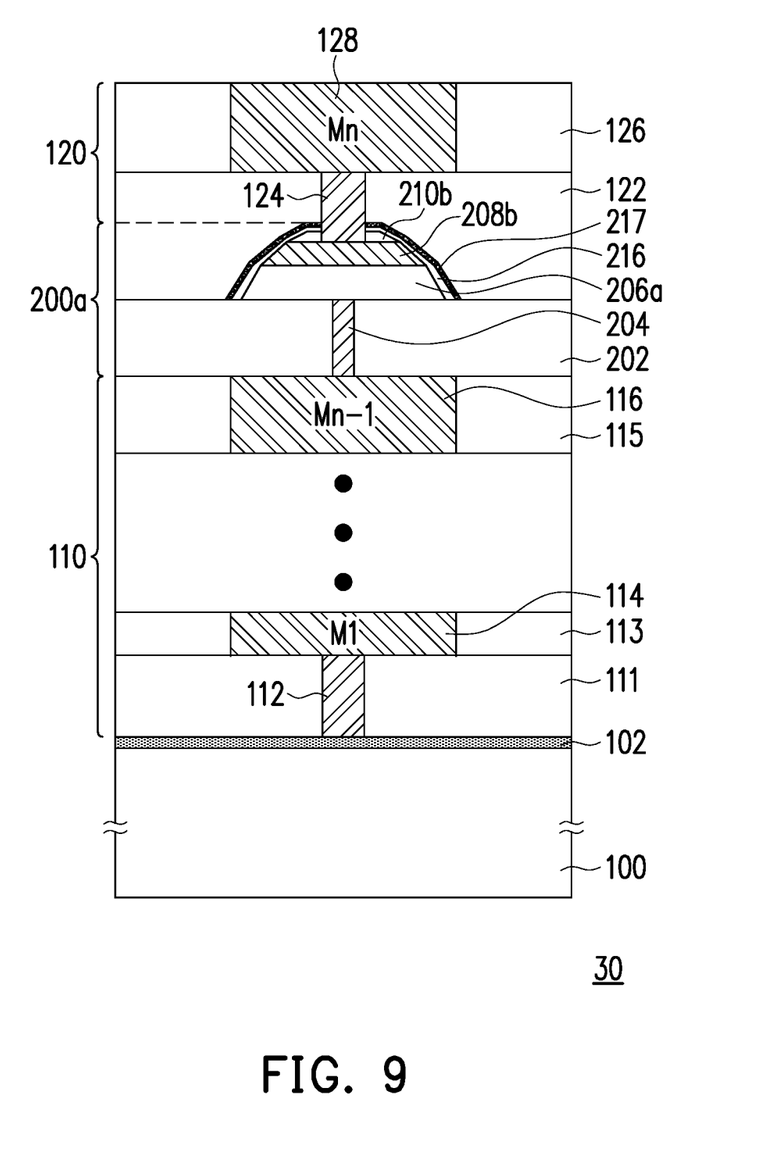
FIG. 9 is a cross-sectional view of a semiconductor device having a memory cell in accordance with a third embodiment.

FIG. 9 is a cross-sectional view of a semiconductor device having a memory cell in accordance with a third embodiment. The memory cell illustrated in the following embodiments is applied to, but not limited thereto, a PCM cell. The structures, materials, and processes may be similar to what are shown in, and discussed referring to, FIG. 7. The details are thus no repeated herein.

Referring to FIG. 9, a semiconductor device 30 may include a substrate 100, a device region 102, a first interconnect structure 110, the memory cell 200a, and a second interconnect structure 120. In some embodiments, the substrate 100 is a semiconductor substrate, such as a bulk semiconductor, a semiconductor-on-insulator (SOI) substrate, or the like. The substrate 100 may be doped (e.g., with a p-type or an n-type dopant) or undoped. The substrate 100 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 102 is disposed on the substrate 100 in a front-end-of-line (FEOL) process. The device region 102 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 102 includes a gate structure, source and drain regions, and isolation structures such as shallow trench isolation (STI) structures (not shown). In the device region 102, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 100. The functions of the devices may include memory, processors, sensors, amplifiers, power distribution, input/output circuitry, or the like.

As shown in FIG. 9, the first interconnect structure 110 is disposed on the device region 102, and the device region 102 is disposed between the substrate 100 and the first interconnect structure 110. In detail, the first interconnect structure 110 may include insulating layers 111, 113, 115, a conductive via 112, and conductive layers 114, 116. The insulating layers 111, 113, 115 are collectively referred to as an IMD layer, which may be made of a dielectric material, such as silicon oxide, silicon nitride, silicon oxynitride, a spin-on dielectric material, or a low-k dielectric material. The conductive via 112 is disposed in the insulating layer 111 and electrically connected to the device region 102. The conductive layer 114 is disposed in the insulating layer 113 and disposed on the conductive via 112. The conductive layer 114 is electrically connected to the device region 102 by the conductive via 112. The conductive layer 116 is disposed in the insulating layer 115 and is electrically connected to the bottom electrode 204. The conductive layers 114, 116 may be conductive lines and may include commonly used conductive materials, such as metals or metal alloys including one or more of Al, AlCu, Cu, T1, TiN, W, and the like. In some embodiments, the conductive layer 116 forms a portion of a current driving circuit (not shown) to provide current to the memory cell 200a.

The memory cell 200a and the second interconnect structure 120 are stacked on the first interconnect structure 110 in order. The memory cell 200a is disposed between and electrically connected the first interconnect structure 110 and the second interconnect structure 120. Specifically, the bottom electrode 204 is in contact and electrically connected to the conductive layer 116, and the top electrode 208b is in contact and electrically connected to the conductive via 124. The conductive layer 116 and the conductive via 124 may provide the current to conduct the storage element layer 206a. Although only the memory cell 200a is illustrated in FIG. 9, the embodiments of the present disclosure are not limited thereto. In other embodiments, the memory cell 200 is used to replace the memory cell 200a.

The second interconnect structure 120 may include insulating layers 122, 126, a conductive via 124, and a conductive layer 128. The insulating layer 122 is disposed on the memory cell 200a to wrap the memory cell 200a. The conductive via 124 is disposed in the insulating layer 122 to electrically connect to the top electrode 208b. The insulating layer 126 is disposed on the insulating layer 122. The conductive layer 128 is disposed in the insulating layer 126. The conductive layer 128 is in contact with and electrically connected to the conductive via 124. In some embodiments, the insulating layers 122 and 126 are collectively referred to as an IMD layer which is made of a dielectric material, such as silicon oxide, silicon nitride, silicon oxynitride, a spin-on dielectric material, or a low-k dielectric material. The conductive layer 128 may be a conductive line, which may include metals or metal alloys including one or more of Al, AlCu, Cu, T1, TiN, W, or the like. The conductive layer 128 is a portion of a current driving circuit (not shown) to provide current to the memory cell 200a. In some embodiments, the conductive via 124 and the conductive layer 128 are formed by a dual damascene process. That is, the conductive via 124 and the conductive layer 128 may be formed simultaneously.

In some embodiments, the conductive layer 114 is referred to as the metal 1 (M1), the conductive layer 116 is referred to as the metal n−1 (Mn−1), and the conductive layer 128 is referred to as the metal n (Mn). The memory cell 200a may be disposed between the Mn and the Mn−1. That is, the memory cell 200a may be disposed between any two adjacent conductive layers in the back-end-of-line (BEOL) structure. For example, the memory cell 200a is disposed between the M2 and the M3, between the M3 and the M4, and so on. Therefore, the fabricating process of the memory cell may be compatible with the BEOL process of the semiconductor device, thereby simplifying process steps and efficiently improving the integration density. In some alternative embodiments, the memory cell 200a is at the same level with the Mn−1. In addition, one or more conductive layers may be further disposed between the M1 and the Mn−1.

According to some embodiments, the memory cell includes a bottom electrode, a top electrode, and a storage element layer. The storage element layer is disposed between the bottom and top electrodes. The storage element layer has a first inclined sidewall, the top electrode has a second inclined sidewall, and an angle of the first inclined sidewall is greater than an angle of the second inclined sidewall.

According to some embodiments, a method of forming a memory cell includes: sequentially forming a storage element material, a top electrode material, and a hard mask material on a bottom electrode; patterning the top electrode material and the hard mask material to form a top electrode and a hard mask layer on the storage element material; and performing an ion bombardment process to remove a portion of the storage element material thereby forming a storage element layer, wherein the performing the ion bombardment process comprises: trimming a sidewall of the storage element layer to form a first inclined sidewall; and trimming a sidewall of the top electrode to form a second inclined sidewall, wherein an angle of the first inclined sidewall is greater than an angle of the second inclined sidewall.

According to some embodiments, a semiconductor device has a memory cell. The semiconductor device includes a memory cell disposed between a first interconnect structure and a second interconnect structure, wherein the memory cell is a bell-shaped structure having an inclined sidewall relative to a top surface of the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a bottom electrode and a top electrode; and
a storage element layer, disposed between the bottom and top electrodes, wherein an extending direction of an outermost sidewall of the storage element layer is different from an extending direction of an outermost sidewall of the top electrode.

2. The memory cell of claim 1, wherein a material of the storage element layer comprises a phase change material, and the phase change material comprises a germanium (Ge)-antimony (Sb)-tellurium (Te) (GST) material or an indium (In)-antimony (Sb)-tellurium (Te) (IST) material.

3. The memory cell of claim 1, further comprising: a protective layer covering the storage element layer and the top electrode, wherein a material of the protective layer is derived from the storage element layer.

4. The memory cell of claim 3, wherein the protective layer and the storage element layer have a same material.

5. The memory cell of claim 3, further comprising a hard mask layer disposed on the top electrode, wherein an extending direction of an outermost sidewall of the hard mask layer is different from the extending direction of the outermost sidewall of the storage element layer and the extending direction of the outermost sidewall of the top electrode.

6. The memory cell of claim 5, wherein the protective layer extends to cover the hard mask layer.

7. The memory cell of claim 6, wherein the protective layer comprises:
a first portion, contacting the outermost sidewall of the storage element layer and having a first thickness;
a second portion, contacting the outermost sidewall of the top electrode and having a second thickness, wherein the first thickness is greater than the second thickness; and
a third portion, contacting the outermost sidewall of the hard mask layer and having a third thickness, wherein the second thickness is greater than the third thickness.

8. The memory cell of claim 3, further comprising a surface treatment layer covering the protective layer.

9. The memory cell of claim 8, wherein a material of the surface treatment layer is derived from the protective layer and the surface treatment layer continuously extends on the protective layer.

10. The memory cell of claim 8, wherein a material of the surface treatment layer is derived from the protective layer and the surface treatment layer is discretely distributed on the protective layer.

11. A semiconductor device, comprising:
a memory cell, disposed between a first interconnect structure and a second interconnect structure, wherein an outermost sidewall of the memory cell has a first portion and a second portion, and the first portion and the second portion are non-parallel.

12. The semiconductor device of claim 11, wherein the memory cell comprises:
a bottom electrode, electrically connected to the first interconnect structure;
a top electrode, disposed on the bottom electrode;
a phase change layer, disposed between the bottom and top electrodes; and
a protective layer, covering the phase change layer and the top electrode, wherein a material of the protective layer is derived from the phase change layer.

13. The semiconductor device of claim 12, further comprising:
a surface treatment layer, covering the protective layer, wherein a material of the surface treatment layer is derived from the protective layer; and
a hard mask layer, disposed between the top electrode and the second interconnect structure, wherein the protective layer extends to cover the hard mask layer.

14. A method of forming a memory cell, comprising:
sequentially forming a storage element material, a top electrode, and a hard mask layer on a bottom electrode;
removing a portion of the storage element material to form a storage element layer, wherein the storage element layer has a sidewall extending along a first direction; and
removing a portion of the top electrode such that the top electrode has a sidewall extending along a second direction that is different form the first direction.

15. The method of claim 14, further comprising:
removing a portion of the hard mask layer such that the hard mask layer has a sidewall extending along a third direction, wherein the third direction is different from the first direction and the second direction.

16. The method of claim 14, further comprising:
forming a protective layer on surfaces of the hard mask layer, the top electrode, and the storage element layer.

17. The method of claim 16, wherein the storage element layer and the protective layer are in-situ formed in a same chamber.

18. The method of claim 16, further comprising performing a surface treatment on the protective layer to form a surface treatment layer on the protective layer.

19. The method of claim 18, wherein the surface treatment comprises a nitridation treatment, and the nitridation treatment comprises introducing a nitrogen gas so that the nitrogen gas reacts with metal elements of the protective layer.

20. The method of claim 18, wherein the surface treatment layer is continuously extending or discretely distributed on the protective layer.

\* \* \* \* \*